United States Patent [19]

Malik et al.

[11] 4,442,445
[45] Apr. 10, 1984

[54] PLANAR DOPED BARRIER GATE FIELD EFFECT TRANSISTOR

[75] Inventors: Roger J. Malik, Little Silver; Thomas R. AuCoin, Ocean City, both of N.J.

[73] Assignee: The United States of America as represented by the Secretary of the Army, Washington, D.C.

[21] Appl. No.: 323,858

[22] Filed: Nov. 23, 1981

[51] Int. Cl.³ ............... H01L 29/80; H01L 29/12; H01L 27/12
[52] U.S. Cl. ...................... 357/22; 357/58; 357/89; 357/4
[58] Field of Search ............. 357/22, 16, 58, 89

[56] References Cited

U.S. PATENT DOCUMENTS

| | | | |
|---|---|---|---|
| 3,984,858 | 10/1976 | Cornu et al. | 357/38 X |
| 3,986,192 | 10/1976 | DiLorenzo et al. | 357/89 |
| 4,075,651 | 2/1978 | James | 357/16 |
| 4,083,062 | 4/1978 | Ohuchi et al. | 357/89 |
| 4,201,604 | 5/1980 | Bierig et al. | 357/89 |

FOREIGN PATENT DOCUMENTS

| | | | |
|---|---|---|---|
| WO81/01073 | 4/1981 | PCT Int'l Appl. | 357/22 E |
| 748487 | 5/1956 | United Kingdom | 357/22 G |
| 1434652 | 5/1976 | United Kingdom | 357/22 G |

Primary Examiner—Andrew J. James
Assistant Examiner—John LaMont
Attorney, Agent, or Firm—Robert P. Gibson; Jeremiah G. Murray; Edward Goldberg

[57] ABSTRACT

Disclosed is an epitaxial layer field effect transistor having a planar doped barrier gate formed on an n-type semiconductor planar channel region between drain and source terminals formed on the surface of the channel region. The semiconductor channel region is fabricated on a semiconductor substrate, preferably GaAs and being separated therefrom by one or more semiconductor planar buffer regions. The planar doped barrier gate comprises an $n^+ - \pi - p^+ - \pi$ structure grown by molecular beam epitaxy over the n-type channel region. Application of an electrical potential to the gate modulates the channel charge depletion in the semiconductor channel region underlying the gate causing a variation in the channel conductance laterally between the source and drain terminals.

14 Claims, 4 Drawing Figures

PLANAR DOPED BARRIER GATE FIELD EFFECT TRANSISTOR

The invention described herein may be manufactured, used, and licensed by or for the Government for governmental purposes without the payment to us of any royalties thereon.

CROSS REFERENCE TO RELATED APPLICATIONS

The present application is related to U.S. Ser. No. 246,787, filed Mar. 23, 1981 and issued Oct. 18, 1983 as U.S. Pat. No. 4,410,902, entitled, "Planar Doped Barrier Semiconductor Device", to Roger J. Malik, one of the present co-inventors and U.S. Ser. No. 300,406, filed Sept. 8, 1981 entitled, "Planar Doped Barrier Transistor", Roger J. Malik, et al. Both of these applications are assigned to the assignee of the present invention and are meant to be specifically incorporated herein by reference.

BACKGROUND OF THE INVENTION

This invention relates to semiconductor devices and more particularly to field effect transistors.

Field effect transistors are well known three terminal semiconductor devices which are used in microwave and millimeter wave applications for low noise and in some instances high power amplification. Typically, metal semiconductor field effect transistors (MESFET) utilize Schottky barrier gates under reverse bias to modulate the channel conductance between the source and drain terminals. However, the Schottky barrier heights on these devices are essentially fixed which restricts the voltage range used on the Schottky gate. In addition, high quality Schottky barriers cannot be obtained in such semiconductors as $Ga_xIn_{1-x}As$ and InP.

In the above referenced copending application issued as U.S. Pat. No. 4,410,902 entitled, "Planar Doped Barrier Semiconductor Device", there is disclosed a majority carrier rectifying barrier semiconductor device having a planar doped barrier. The device is fabricated in GaAs preferably by molecular beam epitaxy (MBE) which results in a semiconductor structure wherein an extremely narrow planar doped space charge region is positioned between adjoining planar regions of nominally undoped semiconductive material. The narrow widths of the undoped regions and the high densities of the ionized impurities within the space charge region results in rectangular electric fields and potential barriers, respectively. Independent and continuous control of the barrier height and the asymmetry of the current vs. voltage characteristics is provided through variation of the acceptor charge density and the undoped region widths.

In the second above-referenced patent application entitled, "Planar Doped Barrier Transistor", there is disclosed a three terminal epitaxial layer semiconductor structure in the form of a transistor comprised of two rectifying planar doped barriers separated by an intermediate semiconductor region with the two barriers having respective predetermined barrier height characteristics which are altered upon the application of a bias potential thereacross and with the intermediate region providing a region for the controlled injection and collection of electrons from one of the barriers whereby majority carriers, such as electrons will surmount and be swept across the other barrier when the peak of the other barrier is below the peak of the first barrier as a result of the applied bias. In such a structure, the majority carrier flow is essentially vertically through the structure.

It is an object of the present invention, therefore, to provide an improvement in field effect semiconductor devices.

Another object of the invention is to provide improvement in field effect transistors.

It is yet another object of the invention to provide a field effect transistor wherein the conventional Schottky barrier gate is replaced with a planar doped barrier gate.

SUMMARY

Briefly, these and other objects are accomplished by means of a field effect transistor including a gate which permits control over the barrier height and reverse voltage characteristics in the gate. The transistor of the subject invention is comprised of a planar doped barrier gate located over a semiconductor planar channel region between source and drain terminals. The device, moreover, is fabricated by molecular beam epitaxial techniques on a semiconductor substrate composed of a Group III-V compound such as gallium arsenide. In one embodiment of the invention, an undoped $\pi$ planar region forms a buffer between the substrate and the semiconductor channel region of the transistor while in a second embodiment, a second planar doped barrier is located between the conductive channel region and the substrate to provide a buffer and thereby provide for improved electron confinement. In either case, the planar doped barrier gate operates to control the conductance in the planar channel region underlying the gate thereby controlling the lateral flow of charge carriers between the drain and source terminals.

DESCRIPTION OF THE PREFERRED EMBODIMENTS

The present invention concerns a device fabricated preferably by the deposition of n-type and p-type dopant atoms by a process known as molecular beam epitaxy (MBE) which is a growth technique wherein precise density dopant atoms are incorporated into extremely thin layers or planes ranging from a single atomic plane to several hundred angstroms. The MBE process has been disclosed, for example, in a publication entitled, "Structures Grown By Molecular Beam Epitaxy", L. L. Chang, et al., J. Vac. Sci. Technol., Vol. 10, No. 5, September/October, 1973 at page 655 and involves the use of selective molecular beams for condensation on a heated substrate in an ultra-high vacuum environment. Due to the relatively slow growth rate and low substrate temperature, very precise epilayer thicknesses and abrupt doping profiles can be obtained. While MBE comprises the preferred method of fabrication, when desirable, the device may be fabricated by chemical vapor deposition (CVD), a process also well known in the art.

Figure 1:
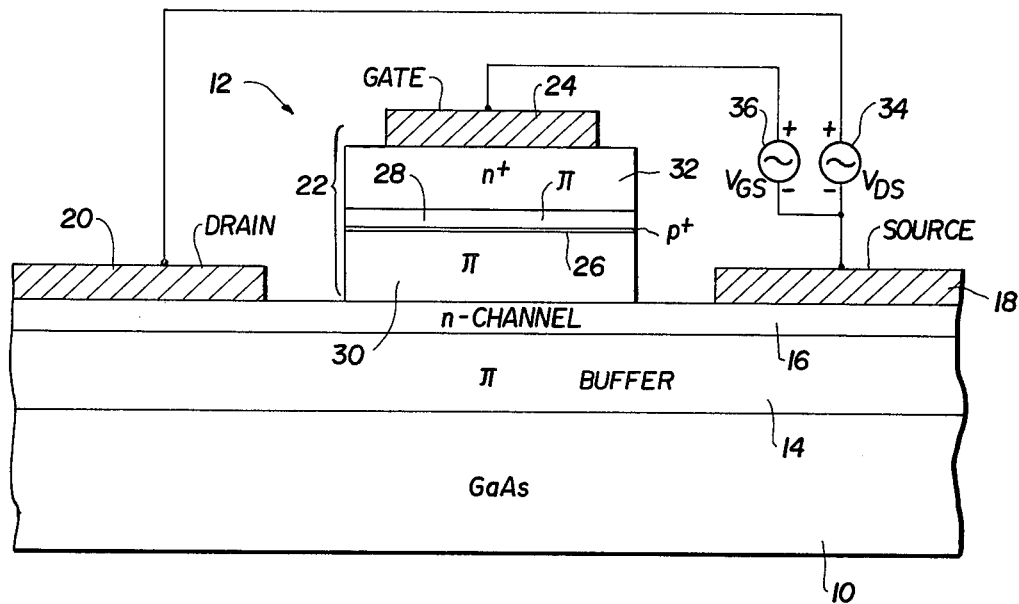
FIG. 1 is a partial cross-sectional view illustrative of a first embodiment of the subject invention.

Referring now to the figures and more particularly to FIG. 1, reference numeral 10 denotes a substrate consisting of a Group III-V compound, preferably gallium arsenide (GaAs) on which is formed a field effect transistor 12 which is separated from the GaAs substrate 10 by a $\pi$ (substantially undoped) buffer region shown as a planar layer 14. In actuality, a $\pi$ region comprises a very low doped planar region of p-type semiconductivity. The field effect transistor 12 is comprised of an n-type planar region or layer 16 which forms a conductive channel between source and drain terminals consisting of ohmic contacts 18 and 20 located on the surface of the n-type layer 16. Located intermediate the source and drain contacts 18 and 20 is a planar doped barrier (PDB) gate terminal consisting of an $n^+ - \pi - p^+ - \pi$ semiconductor layered structure 22 including an ohmic contact 24. The PDB gate 22 consists of a relatively thin, highly doped p+ planar region in the form of a layer 26 which is less than 100 Å in thickness situated between $\pi$ planar regions 28 and 30 of predetermined thicknesses. The relatively thicker $\pi$ region 30 is contiguous with the n channel region 16 while the upper or relatively thinner $\pi$ region 28 is contiguous with a relatively thick highly doped n+ planar region in the form of layer 32.

Figure 3:
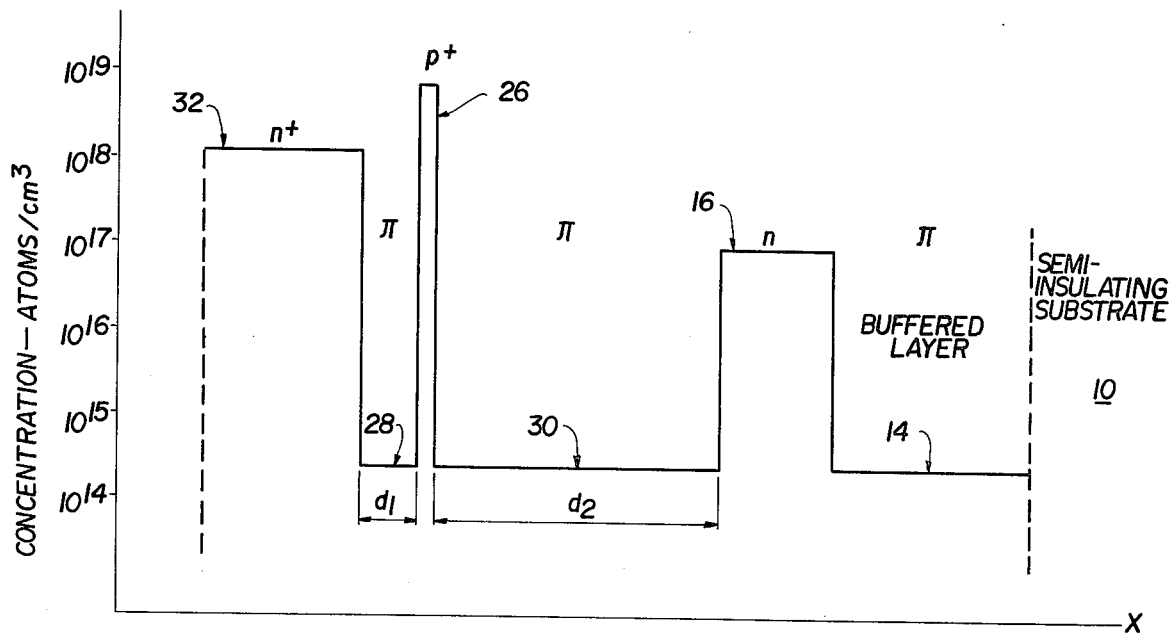
FIG. 3 is a diagram illustrative of doping profile of the embodiment shown in FIG. 1.

It is significant to note that the doping concentration of the $n^+$ planar region 32 is significantly greater than the doping concentration of the n channel planar region 16. This is evidenced by the doping profile of the transistor 12 as shown by FIG. 3. Referring now to FIG. 3, the thin $p^+$ planar region 26 forming the barrier region in the PDB gate 22 has a doping concentration equal to or greater than that of the layer 32 forming the n+ planar region which typically has a concentration of $1 \times 10^{\sim}$ atoms/cm$^3$. The n channel planar region 16, on the other hand, has a relatively smaller concentration being in the order of $1 \times 10^{17}$ atoms/cm$^3$. The dimensions $d_1$ and $d_2$ indicate respective thicknesses of the $\pi$ regions 28 and 30.

Accordingly the zero bias barrier height potential $\phi_{BO}$ can be expressed as:

$$\phi_{BO} = \frac{Q_A}{\epsilon} \left( \frac{d_1 d_2}{d_1 + d_2} \right)$$

where $Q_A$ is the space charge density in the p+ layer 26, $\epsilon$ is the dielectric permittivity of the semiconductor, and $d_1$ and $d_2$ are the above mentioned thicknesses of the $\pi$ regions 28 and 30.

Figure 4:
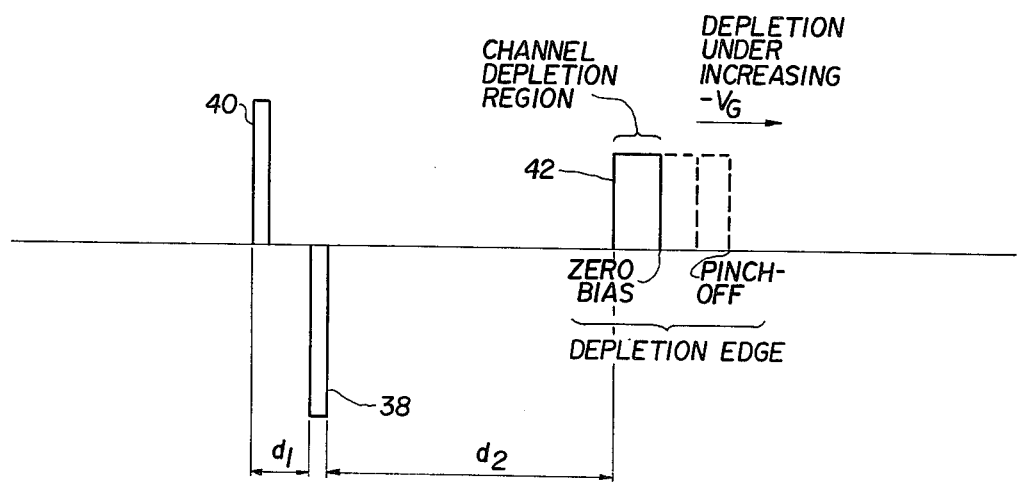
FIG. 4 is a diagram illustrative of a space charge density model of the embodiment shown in FIG. 1.

With the application of a potential $V_{DS}$ from a bias source 34 shown schematically in FIG. 1 having its negative terminal connected to the ohmic contact 18 of the source while the positive terminal is connected to the ohmic contact 20 of the drain and a signal $V_{GS}$ applied between the gate and source from the bias source 36 wherein the positive terminal is connected to the ohmic contact 24 of the PDB gate 22, a well known depletion mode of field effect transistor operation results which can be best illustrated with the aid of the space charge model shown in FIG. 4.

Referring to FIG. 4, reference numeral 38 denotes the space charge region of the p+ PDB gate layer 26 while reference numerals 40 and 42 denote the space charge regions in the n+ PDB gate layer 32 and the n channel region 16, the latter providing a channel depletion region between the source and drain ohmic contacts 18 and 20.

As shown by the dashed lines, the depletion region 42 in the n channel planar region 16 increases in response to an increase in $-V_{GS}$, thereby decreasing the channel conductance between the source and drain contacts 18 and 20. Thus a superposition of a high frequency signal on the PDB gate 22 will result in an AC modulation of the drain to source current, $I_{DS}$. Since the charge in the n channel layer 16 is separated from the ohmic contact 24, a substantially constant gate capacitance is achieved providing increased linearity in the $I_{DS}-V_{GS}$ characteristic, not shown, along with a reduction in intermodulation products. Since the reverse voltage on the planar doped barrier gate 22 can be greater than in a Schottky barrier gate, higher output power can be achieved. While the embodiment of FIG. 1 has been described for depletion type of operation, when desirable the same type charge control can be achieved in an enhancement type of operation by designing the channel region 16 to be fully depleted at zero bias on the gate 22. Also by a reversal of semiconductor types from p to n and n to p of the layers 16, 26 and 32 a complementary type device would result where conduction would be by holes as opposed to electrons as presently described.

The planar doped barrier field effect transistor structure shown in FIG. 1 is preferably grown by fabricating the epilayer structure by molecular beam epitaxy. The structure is formed by growing the planar regions or layers 14 through 32 in sequence after which it is sequentially etched down to the channel region 16 after suitable photo-resist masking of the gate 22 by standard lithographic techniques. Ohmic contacts are then formed for the gate, source and drain contacts 18, 20 and 24. Since all three contacts are ohmic, a self-aligned gate structure can be easily fabricated.

Figure 2:
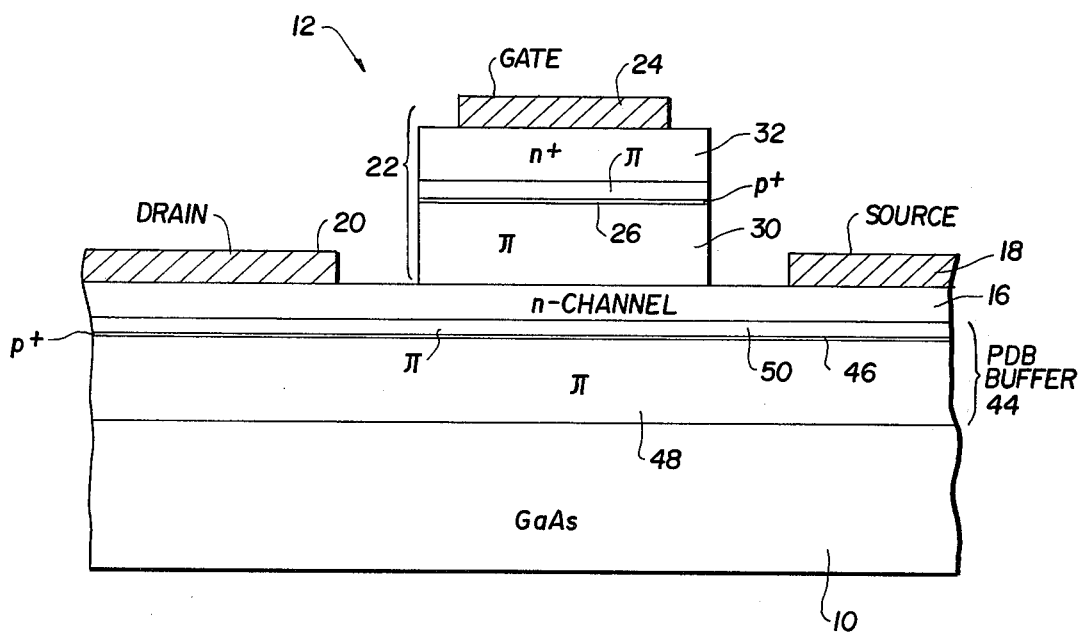
FIG. 2 is a partial cross-sectional view illustrative of a second embodiment of the subject invention.

While the invention thus far has been described with respect to an embodiment wherein a buffer layer 14 of $\pi$ semiconductor material is provided between the substrate 10 and the field effect transistor 12, a second embodiment is shown in FIG. 2 which utilizes a buffer comprised of a second planar doped barrier 44 located between the GaAs substrate 10 and the n channel planar region 16. The second planar doped barrier 44 consists of a relatively thin highly doped p+ region in the form of layer 46 fabricated between a relatively thick $\pi$ planar region 48 which is contiguous to the substrate 10 and an overlying relatively thin $\pi$ planar region 50 which is contiguous to the channel depletion layer 16. The planar doped barrier 44 results in a buffer being formed which results in a higher output impedance for the field effect transistor 12 by preventing electron injection into the substrate 10 near pinch-off, as shown in FIG. 4 being at the extreme condition where the minimum amount of charge remains in the channel depletion region of layer 16 for an increase in the negative bias applied to the gate contact 24. Such a configuration is extremely useful where a reduction in the noise figure of the device is desired.

While the subject invention has been described with a certain degree of particularity, the foregoing has been made by way of illustration and not of limitation. Accordingly, all modifications, alterations and changes coming within the spirit of the invention as set forth in the appended claims are herein meant to be included.

We claim:

1. A three terminal epitaxial layer field effect semiconductor device comprising in combination:

a substrate of semiconductor material;

a planar channel region of semiconductor material of a first predetermined type formed on said substrate and being adapted to operate as a lateral conductive channel for charge carriers associated with said predetermined type;

first and second charge carrier terminal means providing respective source and drain electrodes located on said planar region of said semiconductor material in spaced apart relationship; and control terminal means located intermediate said first and second terminal means for controlling the lateral flow of said charge carriers between said first and second terminal means through said planar channel region, said control terminal means including a planar doped barrier gate layered structure having a pair of substantially undoped planar regions one of which is contiguous to said planar channel region, a relatively thin planar region of highly doped semiconductor material of a second predetermined type positioned between said pair of undoped regions, an outer planar region of highly doped semiconductor material of said first type contiguous to the other of said pair of substantially undoped planar regions, and a gate electrode on said outer region spaced vertically from said planar channel region.

2. The semiconductor device of claim 1 including means applying a direct voltage between said drain and source electrodes and a signal voltage between said gate and source electrodes.

3. The semiconductor device of claim 1 wherein the doping concentration of said outer planar region is high relative to the doping concentration of said planar channel region.

4. The semiconductor device of claim 1 wherein the doping concentration of said outer planar region is substantially ten times the doping concentration of said planar channel region.

5. The semiconductor device of claim 3 wherein the doping concentration of said thin planar region of a second type is equal to or greater than the doping concentration of said outer planar region.

6. The semiconductor device of claim 5 wherein said pair of substantially undoped regions are $\pi$ regions of selective thicknesses.

7. The semiconductor structure as defined by claim 1 wherein said planar channel region comprises an n-type region and said planar doped barrier structure comprises an $n^+-\pi-p^+-\pi$ layered structure, said $n^+$ layer being said outer planar region, said $\pi$ layers including said pair of substantially undoped planar regions, and said $p^+$ layer being said thin planar region.

8. The semiconductor device of claim 6 wherein said planar channel region comprises n-type semiconductor material and wherein said substrate is comprised of a Group III-V compound.

9. The semiconductor device of claim 8 wherein said substrate is of gallium arsenide.

10. The semiconductor structure of claim 1 and additionally including a semiconductor buffer layer located between said substrate and said planar channel region.

11. The semiconductor device of claim 10 wherein said semiconductor buffer layer is a substantially undoped planar region of semiconductor material.

12. The semiconductor device of claim 10 wherein said semiconductor buffer layer is a $\pi$ region.

13. The semiconductor device of claim 11 including another relatively thin planar region of highly doped semiconductor material of said second predetermined type located within said buffer layer and wherein said buffer layer is of $\pi$ type semiconductor material.

14. The semiconductor device as defined by claim 13 wherein said planar channel region is an n-type region and said planar doped barrier structure includes an $n^+-\pi-p^+-\pi$ structure and said buffer layer is a $\pi-p^+-\pi$ structure.

* * * * *